Figure 1:
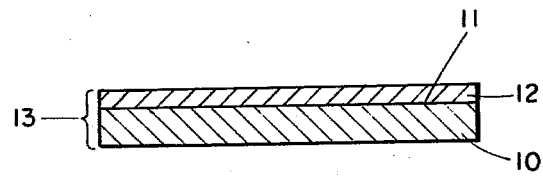

United States Patent [19]

Merrill et al.

[11] 4,224,399

[45] Sep. 23, 1980

[54] PHOTOCROSSLINKABLE COMPOSITIONS FOR LITHOGRAPHIC PRINTING PLATES

[75] Inventors: Richard E. Merrill, Wakefield; Arthur A. Massucco, Natick, both of Mass.

[73] Assignee: Arthur D. Little, Inc., Cambridge, Mass.

[21] Appl. No.: 33,194

[22] Filed: Apr. 25, 1979

Related U.S. Application Data

[60] Continuation-in-part of Ser. No. 770,272, Feb. 22, 1977, abandoned, Ser. No. 958,712, Nov. 8, 1978, and Ser. No. 970,196, Dec. 18, 1978, which is a continuation-in-part of Ser. No. 770,272, , said Ser. No. 958,712, is a division of Ser. No. 770,272, , abandoned.

[51] Int. Cl.² ............... G03F 7/02; G03C 5/00
[52] U.S. Cl. .................. 430/282; 204/154.14; 204/159.19; 430/284; 430/285; 430/286; 430/302; 430/306; 430/325; 430/927; 101/456; 101/457; 101/467
[58] Field of Search .......... 96/33, 115 P, 115 R, 96/35.1; 260/859 R; 204/159.14, 159.19; 101/456, 457, 467

[56] References Cited

U.S. PATENT DOCUMENTS

| | | | |
|---|---|---|---|
| 3,035,004 | 5/1962 | Glavis | 260/29.7 W |
| 3,459,790 | 8/1969 | Smith | 260/874 X |
| 3,493,500 | 2/1970 | Volk et al. | 260/874 X |
| 3,932,401 | 1/1976 | Berg et al. | 260/248 |
| 3,960,572 | 1/1976 | Ibata et al. | 96/115 |

Primary Examiner—Edward C. Kimlin
Assistant Examiner—Alfonso T. Suro Picó
Attorney, Agent, or Firm—Bessie A. Lepper

[57] ABSTRACT

A lithographic printing plate in which the oleophilic imaging areas are formed as a thin cross-linked block copolymer film adhered to the hydrophilic surface of a backing plate. The block copolymer comprises blocks of copolylacrylate and polyurethane wherein the copolyacrylate blocks are a copolymer of a hydroxy-containing acrylate and a second acrylate component comprising one or more esters of acrylic acid or methacrylic acid or mixtures thereof and the polyurethane blocks are formed of polyoxybutylene as the prepolymer component. In forming the printing plate the block copolymer is deposited as a thin film containing an ultraviolet initiator and a cross linking promoter and the cross-linked imaging areas are formed by exposure to ultraviolet radiation.

8 Claims, 4 Drawing Figures

PHOTOCROSSLINKABLE COMPOSITIONS FOR LITHOGRAPHIC PRINTING PLATES

This application is a continuation-in-part of U.S. Ser. No. 770,272, filed Feb. 22, 1977, now abandoned, of Ser. No. 958,712, filed Nov. 8, 1978, as a divisional application of Ser. No. 770,272, and of Ser. No. 970,196, filed Dec. 18, 1978, as a continuation-in-part of Ser. No. 770,272.

This invention relates to printing plates and more particularly to lithographic printing plates especially suitable for offset printing and to novel block copolymers and coating compositions used to form the printing plates.

Lithographic printing plates are characterized by the fact that they have printing or image areas and nonprinting or nonimage areas in the same plane, the image areas being oleophilic and hydrophobic and the nonimage areas being hydrophilic and oleophobic. In printing with such a lithographic plate, an oil-based ink adheres to the image areas but not to the nonimage areas. Although the ink may be transferred from the plate directly to a receptor surface using, for example, a direct rotary press, it is normally transferred from the plate to a blanket roll or cylinder and then to a receptor surface, the latter technique being termed offset printing.

Lithographic printing has been known and used for many years; and so-called "photolithography" has more recently become a widely used technique, replacing for many printing applications letterpress printing which requires the formation of a printing plate having the printing or image areas raised above the plate surface. The ability to form a lithographic plate using photographic techniques, rather than the laborious process of typesetting or the exacting process of forming raised durable, well-defined indicia in a relatively thick plate coating, has materially increased the scope and range of printing jobs performed by lithography and particularly by offset printing. With the advent of margin justifying word processing equipment, high-speed photography and improved lithographic plates, offset printing has come to be used even in the printing of newspapers, books and the like where large numbers of copies are run.

In photolithography a thin coating of a photosensitive material is adhered to a plate which is generally a metal, although a plastic or special paper may be used for some special, limited applications. The metal plate is normally aluminum or zinc, or a combination of metal layers such as electrolitically deposited chromium on copper which may or may not be backed up with another metal such as steel or zinc to contribute strength and dimensional stability. The coatings on these plates are photosensitive in that upon exposure to light through the transparent areas of a photographic negative they become insolubilized making it possible to remove the areas not so exposed with a suitable solvent to expose the plate surface. Thus the insolubilized areas become the image areas while the exposed plate areas become the nonimage areas.

Three general classes of coatings have been used, namely, dichromated materials such as gelatin, glue, gum arabic or albumin; diazo compounds, e.g., diazo diphenylamines, with or without reinforcing resins or lacquers; and cross-linkable polymers such as the acrylates containing photoinitiators and cross-linking promoters. Recent investigations indicate that the dichromate sensitizers, potassium and ammonium dichromates, have toxic levels which make them environmentally unacceptable. When the diazo compounds are used neat the resulting coatings have very short shelf lives, making it almost mandatory that the lithographic plates using them be prepared in the printing shop. In using the diazo sensitizers with resins to form presensitized plates, it is common practice to form hardened image areas by exposing the coatings to light through a negative and then washing away the nonhardened areas. Alternatively, the presensitized plate may be used to form a stencil which is then used in a further step to manipulate the plate surface, such as by electroplating or by a suitable chemical treatment, to form oleophilic imaging and hydrophilic nonimaging areas thereon. Through the use of such stencils it is possible, for example, to form lithographic plates having copper oleophilic image areas and chromium hydrophic nonimage areas. Although the resulting plates, particularly those having an additional metal backing, have sufficient strength and dimensional stability to print a large number of copies, they are costly and time-consuming to make, requiring skilled artisans for their manufacture.

More recently, photopolymers have been used as thin film coatings. These photopolymers typically comprise one or more cross-linkable resins, one or more cross-linking promoters and a photoinitiator. Upon exposure to a predetermined range of electromagnetic radiation, e.g., the ultraviolet range, the polymer is cross-linked and insolubilized, making it possible to wash out the unexposed coating to leave the free metal surface as the nonimage area while the insoluble polymer remains adhered to the plate as the image areas. Although this is the most direct, least time-consuming and usually the most economical technique for forming lithographic plates, it demands that the resulting photolithographic surface possess a combination of properties if the printing plate is to be suitable for large printing runs, e.g., up to as many as 300,000 copies.

Among the most important characteristics required of the coating in forming the lithographic printing plates is the ability to form a very thin layer of cross-linked polymers capable of being firmly adhered to the metal surface of the plate and having good affinity for printing inks but not for water. Prior to cross linking, the coating film should exhibit good dark stability. Moreover, the cross-linked polymer forming the image areas should be insoluble in water and should not imbibe water or the etches and fountain solutions normally used in plate making and printing. In addition, the cross-linked polymer must be resistant to mechanical wear during printing. The technique of forming lithographic plates using photopolymers requires, of course, that the unexposed, noncross-linked areas can be developed using water or a water/alcohol mixture to leave the metal clean in a lithographic sense and the edges of the image area sharp and well-defined. Finally, the lithographic plates should exhibit no appreciable sensitivity to oxygen.

It is also highly desirable that the degree of skill required to convert the presensitized plate to a lithographic plate be of such a level that the lithographic plates can be formed routinely by a trained technician rather than requiring highly-skilled artisans.

The provision of a photopolymer which makes it possible to form a coating composition for preparing a lithographic printing plate which attains or approaches attainment of these characteristics as well as the provision of an improved presensitized plate useable for forming a lithographic plate is therefore desirable. This goal in accordance with this invention is realized through the use of unique block copolymers and coating compositions made therefrom.

It is therefore a primary object of this invention to provide novel block copolymers which are particularly suited for use in forming photolithographic printing plates. It is another object to provide block copolymers of the character described which, when cross-linked, possess good mechanical strength when adhered as thin films to a metal plate and which are oleophilic, hydrophobic, water-insoluble and exhibit good printing ink adherence. A still further object is the providing of a novel copolyacrylate/polyurethane block copolymer in which the polyurethane blocks are formed of polyoxybutylene as the prepolymer component.

It is another primary object of this invention to provide new ultraviolet-cross-linkable liquid coating compositions for preparing presensitized photolithographic plates from which lithographic plates can be prepared to have the properties required of a printing plate suitable for making a large number of copies of acceptable quality.

An additional primary object of this invention is to provide an improved lithographic printing plate particularly suitable for the offset printing of a large number of copies.

A further object is to provide a method of forming the improved presensitized photolithographic plates and lithographic printing plates of this invention.

Other objects of the invention will in part be obvious and will in part be apparent hereinafter.

The invention accordingly comprises the several steps and the relation of one or more of such steps with respect to each of the others, the composition possessing the features, properties and the relation of constituents and the article possessing the features, properties and the relation of elements, all as exemplified in the detailed disclosure hereinafter set forth, and the scope of the invention will be indicated in the claims.

Figure 2:
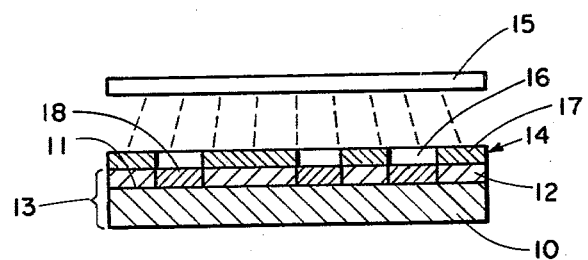
Figure 3:
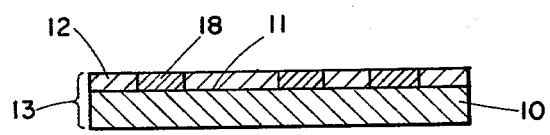
Figure 4:
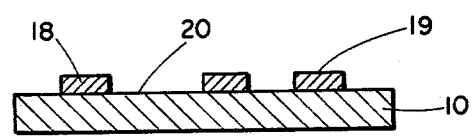

For a fuller understanding of the nature and objects of this invention, reference should be had to the following detailed description taken in connection with the accompanying drawings in which:

FIG. 1 is a cross section of a presensitized plate constructed in accordance with this invention prior to forming the cross-linked imaging areas; and FIGS. 2–4 illustrate the steps of forming a lithographic plate using the presensitized plate of FIG. 1.

According to one aspect of this invention there is provided a block copolymer comprising by weight from about 60% to about 90% copolyacrylate blocks and from about 10% to about 40% polyurethane blocks, the copolyacrylate blocks comprising by copolyacrylate weight from about 50% to about 95% of a hydroxy-containing acrylate and from about 5% to about 50% of a second acrylate which comprises one or more esters of acrylic acid or methacrylic acid or mixtures thereof and the polyurethane blocks being formed of polyoxybutylene as the prepolymer constituent.

According to another aspect of this invention there is provided a liquid coating composition suitable for forming a radiation-cross-linkable film on a lithographic printing plate; comprising a block copolymer formed of blocks of a copolyacrylate and of a polyurethane, the copolyacrylate comprising a copolymer of a hydroxy-containing acrylate and a second acrylate component which comprises one or more esters of acrylic acid or methacrylic acid or a mixture thereof and the polyurethane being formed of polyoxybutylene as the prepolymer constituent; a solvent for the block copolymer; an ultraviolet initiator; at least one cross-linking promoter; and a wetting agent; the coating composition containing from about 2% to about 15% weight percent of the block copolymer and having a viscosity no greater than that which permits applying the liquid composition onto the surface of the printing plate to form the film no greater than about 6$\mu$ in thickness.

According to yet another aspect of this invention there is provided a presensitized photolithographic printing plate, comprising in combination a backing plate having a hydrophilic oleophobic surface; and a photosensitive cross-linkable polymeric film adhered to the hydrophilic surface, the film being no greater than about 6$\mu$ thick and comprising a block copolymer of a hydroxy-containing acrylate and a second acrylate component which comprises one or more esters of acrylic acid or methacrylic acid or mixtures thereof and the polyurethane being formed of polyoxybutylene as the prepolymer component; an ultraviolet initiator and at least one cross-linking promoter.

According to a further aspect of this invention there is provided a lithographic printing plate, comprising in combination a backing plate having a hydrophilic surface; and oleophilic image areas firmly adhered to the hydrophilic surface in the form of a cross-linked copolyacrylate/polyurethane block copolymer thin film, the copolyacrylate comprising a copolymer of a hydoxy-containing acrylate and a second acrylate component which comprises one or more esters of acrylic acid or methacrylic acid or mixtures thereof and the polyurethane being formed of polyoxybutylene as the prepolymer component, the film defining the image areas being formed by applying a liquid coating composition containing the block copolymer to the backing plate to form thereon a cross-linkable film, cross-linking the film in the areas corresponding to the desired image areas and then removing the noncross-linked film thereby to expose the hydrophilic surface in nonimage areas.

According to yet another aspect of this invention there is provided a method of preparing a lithographic printing plate comprising the steps of affixing to the hydrophilic surface of a backing plate a coating composition comprising a block copolymer formed of blocks of a copolyacrylate and a polyurethane, the copolyacrylate comprising a copolymer of a hydroxy-containing acrylate and a second acrylate component which comprises one or more esters of acrylic acid or methacrylic acid or mixtures thereof, and the polyurethane being formed of polyoxybutylene as the prepolymer constituent, a solvent removable in the drying, an ultraviolet initiator, at least one cross-linking promoter, and a flow control agent; producing in the coating oleophilic imaging areas by exposing the film on the backing plate to ultraviolet radiation through a master defining the imaging areas as a transparent pattern to cross-link the film in areas corresponding to the transparent pattern; and forming a lithographic printing plate by removing from the backing plate that portion of the coating which is not cross-linked by exposure to ultraviolet radiation thereby exposing the hydrophilic surface as nonimaging areas.

The objects of this invention are attained through the use of a unique class of block copolymers and coating compositions made therefrom. The unique block copolymers of this invention are copolyacrylate/polyurethane block copolymers in which the copolyacrylate blocks are copolymers of at least one hydroxy-containing acrylate and a second acrylate comprising one or more esters of acrylic acid or methacrylic acid or mixtures thereof wherein the esters may be, but preferably are not, partially substituted with bromine. To attain the necessary strength, hydrophobicity and other desired physical properties in the cross-linked polymeric coating forming the image areas of the lithographic plate, the polyurethane blocks are formed using polyoxybutylene as the prepolymer constituent.

The block copolymers of this invention are prepared by the same general method disclosed by Tobolsky in U.S. Pat. Nos. 3,865,898, 3,291,859, and 3,257,476. However, as discussed below, certain significant modifications in the basic Tobolsky technology are required to form lithographic plates. In accordance with the general method disclosed in the Tobolsky patents, a polymeric constituent or prepolymer, such as a polyether or a polyester, is reacted in the presence of a catalyst with a diisocyanate to form what is referred to as a "diisocyanate-capped" prepolymer. According to Tobolsky, the preferred polyether is either a hydroxy-terminated polyoxypropylene or a hydroxy-terminated polyoxyethylene. The diisocyanate-capped prepolymer is then reacted in the presence of additional catalyst with a hydroperoxide or a dihydroperoxide, such as 2,5-dimethyl-2,5-bis(hydroperoxy)hexane to form a peroxycarbamate, such as bis(2,5-dimethyl-2-dihydroperoxyhexane-5-peroxycarbamate) polyether. Chain extension of the polyether polymer constituent may be effected in this second reaction if desired by addition of a suitable chain extender, such as butanediol, to the reaction mixture. The peroxycarbamate is then reacted with one or more ethylenically-unsaturated monomers, the active sites in the peroxycarbamate serving to initiate the free radical polymerization of the monomer.

Further in accordance with the teaching of Tobolsky, the reaction forming the peroxycarbamate is best conducted in a solvent, such as toluene. The product of this reaction (i.e., the peroxycarbamate solution) may then be mixed with additional solvent and one or more ethylenically unsaturated monomers which form the polyvinyl blocks of the block copolymers. The final block copolymer may be formed by solution, dispersion or bulk polymerization depending upon the nature of the peroxycarbamate and the ethylenically unsaturated monomer.

In copending application Ser. Nos. 770,272, 844,633, both now abandoned, 958,712 and 970,196, we have described and claimed block copolymers of the Tobolsky type for screen printing stencils. For this purpose it has been found preferable to use two different polyethers, one of which may be polyoxybutylene in forming the polyurethane block of the block copolymer. The mixing of two polyethers makes possible the attainment of the optimum balancing of physical and chemical properties in the final coating film on the printing screen stencil as well as the ability to more readily exercise control over the molecular weight of the polyurethane blocks and to balance the hydrophobic and hydrophilic characteristics of the film, which, in turn, makes the resulting screen printing stencil resistant to both water-based and oil-based inks. Thus, in contrast to the requirements for a lithographic printing plate, the cross-linked block copolymer forming the indicia on a screen printing stencil must be flexible and must possess a unique balance of hydrophobicity and oleophobicity.

In applying the teaching of Tobolsky to the formation of lithographic printing plates which possess the desired chemical and physical properties, e.g., mechanical strength, oleophilic/hydrophobic surface characteristics, and good adherence to the metal plate surface, it is necessary to make significant modifications and improvements in the block copolymers of Tobolsky including those uniquely suitable for the manufacture of screen printing stencils. These modifications will become apparent hereinafter.

The diisocyanates which may be used in the practice of this invention include, but are not limited to, toluene diisocyanate, bis(4-isocyanatocyclohexyl)methane, hexamethylene diisocyanate, 4,4'diphenylmethane diisocyanate, isophorone diisocyanate and trimethylhexamethylene diisocyanate. Bis(4-isocyanatocyclohexyl)methane is preferred.

The hydroperoxides and dihydroperoxides used in preparing peroxycarbamates in the practice of this invention are those having one or two terminal —OOH groups and include, but are not limited to, cumene hydroperoxide, t-butyl hydroperoxide, tetralin hydroperoxide, phenylcyclohexane hydroperoxide, diisopropyl benzene hydroperoxide, p-methane hydroperoxide, pinane hydroperoxide and 2,5-dimethyl-2,5-bis(hydroperoxy)-hexane. Of these, 2,5-dimethyl-2,5-bis(hydroperoxy)hexane is preferred.

The hydroxy-containing acrylates used to form the copolyacrylate blocks of the block copolymers of this invention include, but are not limited to, 2-hydroxyethyl acrylate, hydroxypropyl acrylates, 2-hydroxyethyl methacrylate and hydroxypropyl methacrylates. Of these, 2-hydroxyethyl methacrylate is preferred. The acrylates used in the copolyacrylate blocks include, but are not limited to, the esters of acrylic acid such as methyl and ethyl acrylates and the esters of methacrylic acid such as methyl methacrylate and mixtures thereof.

It is also within the scope of this invention to use acrylates which are partially substituted with bromine as the acrylate monomer in forming the copolyacrylate blocks of the block copolymer of this invention. Exemplary of such bromine-substituted acrylates are dibromopropyl methacrylate and dibromopropyl acrylate.

The preparation of the block copolymers of this invention is illustrated in Examples 1-4.

EXAMPLE 1

500 grams of dry polyoxybutylene having a molecular weight of about 2,000, 313 grams of toluene, 136 grams of bis(4-isocyanatocyclohexyl)methane and 0.5 gram dibutyltin dilaurate were added to a 1.5-liter, 3-necked reaction flask equipped with an agitator and a nitrogen purge and heated in a controlled temperature oil bath. The contents were purged with dry nitrogen and heated rapidly to 80° C. while being agitated. An isocyanate analysis (ASTM Test No. D2572-67T) was made after 6 hours at 80° C. and, based upon the results of this analysis, 19.7 grams of 2,5-dimethyl-2,5-bis(hydroperoxy)hexane, 8.5 grams of butane diol, 2.5 grams dibutyltin dilaurate and 269 grams toluene were added to the flask, and the temperature maintained at 50° C. for a period of 7 hours. At that time isocyanate analysis indicated an isocyanate content of less than 0.05 percent by weight, which was taken as an indication that the reaction was complete. The clear, viscous peroxycarbamate solution could be used immediately to form the block copolymer or it could be transferred to glass bottles and refrigerated. Upon cooling, the product became a soft, waxy, opaque solid. Total solids were determined to be 53% by weight.

25 grams of the peroxycarbamate thus formed, 31.3 grams of 2-hydroxyethyl methacrylate, 18.7 grams of methyl methacrylate and 175 grams of ethylene glycol monomethyl ether were added to a capped, one-half liter flask which was flushed well with carbon dioxide and then capped before being placed in an oil bath preheated to 85° C. Heating of the contents of the jar was continued for five hours at 85° C. The block copolymer formed was a clear, very slightly yellow syrup when cooled to room temperature. The block copolymer syrup thus prepared had a Brookfield viscosity at 25° C. of 500 centipoises using a No. 4 spindle at 50 rpm and a solids content of 25%. It was suitable for direct incorporation into a coating composition.

EXAMPLES 2 AND 3

Two additional block copolymer syrups were prepared in the same manner as described in Example 1, using a peroxycarbamate material having a solids content of 53% by weight. The reactants for and properties of these syrups are tabulated in Table 1 below as Examples 2 and 3:

TABLE I

Preparation of Polyacrylate/Polyurethane Block Copolymer Syrups

| | Ex. 2 | Ex. 3 |
|---|---|---|
| Ingredients | | |
| peroxycarbamate, gms. (53% solids) | 37.7 | 37.7 |
| ethylene glycol monomethyl ether, gms. | 280 | 280 |
| 2-hydroxyethyl methacrylate, gms. | 50 | 30 |
| ethyl methacrylate, gms. | 30 | 50 |
| Properties of Syrup | | |
| % solids | 23.9 | 23.9 |
| Brookfield viscosity, centipoises (No. 4 spindle; 50 rpm, 25° C.) | 480 | 350 |
| color | amber | amber |

EXAMPLE 4

In a similar manner a copolyacrylate polyurethane block copolymer was made by reacting under carbon dioxide 80 grams of the peroxycarbamate, 100 grams of 2-hydroxyethyl methacrylate, 60 grams of dibromopropyl methacrylate in 560 grams of ethylene glycol monomethyl ether for seven and one-half hours at 85° C. The resulting light yellow syrup, having a 25% by weight solids content, was suitable for formulating photosensitive coating compositions for making lithographic plates.

It is also within the scope of this invention, if desired, to isolate the block copolymer from the syrup by any suitable technique such as by precipitating it with water and subsequently drying it. The dry solid block copolymer may then be reconstituted into a syrup with a suitable solvent or added as a solid in the formulation of the coating compositions.

The relative amounts of polyurethane and copolyacrylate in the block copolymer, as well as the relative amounts of the two types of acrylates making up the copolyacrylate blocks, may be varied to achieve desired combinations of characteristics in the films made with the block copolymers. Thus, the amount of polyurethane relative to the amount of copolyacrylate in the block copolymer may be chosen to achieve a balance between flexibility and durability. Lithographic printing plates must possess sufficient flexibility to permit them to be attached around a plate cylinder; and they must possess sufficient durability and mechanical strength to make a relatively large number of contacts (as many as 50,000 to 300,000) with either the blanket cylinder of an offset press or directly with a surface to be printed on. Thus in formulating the block copolymer of this invention, the greater the amount of polyurethane in the block copolymer the greater will be the flexibility of the film; but at the sacrifice of some degree of durability. Decreasing the amount of polyurethane will increase durability and along with increased durability the degree of flexibility will be somewhat decreased.

The amount of hydroxy-containing acrylate relative to the amount of other acrylate or methacrylate monomer in the copolyacrylate affects the solubility of the noncross-linked block copolymer in polar solvents such as the water/alcohol mixtures used to "develop" the exposed film. This characteristic is of particular importance during the removal of the noncross-linked material to form the nonimage areas on the lithographic plate.

Block copolymers having characteristics which are desirable for the making of lithographic printing plates preferably comprise from about 60 to about 90 percent by block copolymer weight of copolyacrylate and from about 10 to about 40 percent by weight of polyurethane. The copolyacrylate preferably comprises from about 50 to about 95 percent by copolyacrylate weight of hydroxy-containing acrylate and from about 5 to 50 percent by weight of acrylate or methacrylate whether or not it contains bromine as a substituent. A preferred block copolymer for making lithographic printing plates according to this invention is one comprising from about 60 to 80 percent copolyacrylate and from 40 to 20 percent polyurethane by weight, the copolyacrylate comprising from about 60 to 65 percent 2-hydroxyethyl methacrylate and from 35 to 40 percent acrylate or methacrylate by weight.

The molecular weight of the final block copolymer must not be above that which permits the formation of a syrup with at least 15% solids concentration having a viscosity no greater than about 500 to 1000 centipoises at 25° C. The use of polyoxybutylene having a molecular weight of about 2000 to prepare the polyurethane blocks has been found to result in the formation of block copolymer syrups having the desired viscosity range. The optimum viscosity may easily be determined with reference to the technique employed in applying the required thin film containing the block copolymer to the lithographic plate blank. The monitoring of the molecular weight of the block copolymer as polymerization progresses is therefore easily accomplished by periodically measuring the viscosity of the syrup.

Although, as noted above, the block copolymers may be recovered from the syrups in which they are prepared, it is generally preferable to employ the syrups, such as those prepared in Example 1, directly in the formulation of the coating compositions used to form the thin films on the metal surfaces in the preparation of the printing plates.

In practicing this invention, the block copolymers are applied to the metal plate surfaces as solutions having a solids concentration and viscosity which permit forming very thin films, e.g., from about 1μ to 6μ thick, on the plates. Thus the coating composition is one which may be used in the preparation of wipe-on plates. The coating solutions include at least one cross-linking promoter, at least one ultraviolet initiator and, preferably, a wetting agent to improve adhesion of the coating to the plate. Thus, another aspect of this invention is the providing of a lithographic printing plate coating composition.

When the block copolymer syrup is used directly to form the coating composition, it is necessary to add only that quantity of solvent necessary to reduce the viscosity to a level which makes it possible to apply the coating in a thickness to attain the desired final film thickness. Thus, additional solvent, the cross-linking promoter and ultraviolet initiator, along with any other desired additives, are added directly to the polymer syrup. When, however, a precipitated form of the copolymer is used in preparing the coating compositions of this invention, the copolymer is dissolved in a solvent to prepare a coating solution. To attain the desired film thicknesses on the photolithographic plates, coating compositions having total solids concentrations ranging between about 2% and about 15% weight are required, with from about 5% to about 10% being preferred. The viscosity of the coating compositions preferably ranges between about 25 and about 200 centipoises.

The solvents used in preparing coating compositions according to this invention are those which may be considered to be of intermediate volatility, among which are ethylene glycol monomethyl ether, ethyl alcohol, n-propyl alcohol, isopropyl alcohol, blends of ethylene glycol monomethyl ether with methylethyl ketone, ethyl alcohol, dimethyl formamide, isopropyl alcohol and the like. It is, of course, also within the scope of this invention to choose other organic solvents.

In formulating the coating composition of this invention, small amounts of ultraviolet initiators are included to accelerate the cross-linking or curing of the coatings upon exposure to ultraviolet radiation. When exposed to ultraviolet radiation, these initiators are thought to generate free radicals which initiate the cross-linking of the block copolymer in the coating. Among the ultraviolet initiators which may be used in the coating compositions of this invention, phenanthrenequione is preferred since this initiator is more nearly matched against the spectral output of the more commonly used ultraviolet sources. Although an ultraviolet initiator concentration ranging from about 0.01% to about 5.0% by block copolymer weight may be used, concentrations ranging from about 0.1% to about 3% by weight are preferred.

The coating compositions of this invention also generally include small amounts of one or more cross-linking promoters in their formulations. These compounds serve to extend the degree of cross-linking which may be achieved by providing bridges or links between reactive sites of different block copolymer molecules. The nature of the cross-linking promoter and the amount used influence the degree of cross-linking, and therefore, the hardness and durability of the final coating. The hardness of the final coating, in turn, determines how well the image areas on the printing plate can be formed to match the mechanical strength of the metal plate to which the image area film adheres. Thus, if an insufficient degree of cross-linking is achieved, the image area film tends to be too soft, and may not wear well during printing operations. If, on the other hand, too much cross-linking is achieved, the image area film tends to be too hard and brittle, and may crack during printing operations thereby resulting in defective prints.

There are many known cross-linking promoters which may be advantageously used in formulating the coating compositions of this invention, and the optimum amount of this component may be readily determined without any undue experimentation. The preferred cross-linking promoters for use in preparing the coating compositions of this invention are those generally designated as multifunctional olefin cross-linking agents which include, but are not limited to, polyethylene glycol diacrylates, pentaerythritol triacrylate, trimethylolpropane triacrylate and mixtures thereof. These are preferably used at concentrations of up to about 20% by weight based on the total weight of block copolymer in the coating composition.

Because of the techniques normally used in applying the coating compositions to the printing plate surfaces to obtain the very thin films, it is preferable to add a small but effective amount of a wetting agent which serves to promote adhesion of the film to the plate. These are commercially available.

In formulating the coating composition of this invention the individual ingredients may be compounded using conventional techniques. Thus, for example, to block copolymer in the form of a syrup may be added any additional solvent, the ultraviolet initiator and cross-linking promoter. A conventional mixer, such as a high-speed blender may be used, and the entire formulation procedure may be carried out at room temperature. Since the coating compositions of this invention are generally noncorrosive, conventional processing equipment may be used; however, it may be preferable to use stainless steel or glass lined equipment to minimize the possibility of contamination. The preparation of the coating compositions of this invention is illustrated in Example 5.

EXAMPLE 5

To 60 grams of the polymer syrup prepared in Example 1 were added 117 milligrams of phenanthrenequinone, 621 milligrams of tetraethylglycol diacrylate, 621 milligrams of trimethylolpropane triacrylate, 6 drops (about 150 milligrams) of a wetting agent and adhesion promoter (sold as Dapro W-77 by Daniel Products Co.), 54.9 grams of denatured ethanol and 64.9 grams of ethylene glycol monomethyl ether. These were mixed well in a closed glass container until all of the phenanthrenequinone was dissolved. The resulting liquid coating composition had a solids content of 8.65% by weight and a Brookfield viscosity of 60 cps at 25° C. using a No. 2 spindle at 100 rpm. If this coating composition is not used immediately to form the presensitized plates, it may be stored in dark, e.g., amber, containers and/or under yellow fluorescent light or in a dark room.

EXAMPLES 6 AND 7

Using the same amounts of ingredients and the same procedure as in Example 5, two additional coating formulations were made with the block copolymer syrups of Examples 2 and 3, to give coating compositions designated Examples 6 and 7, respectively. The solids contents of these compositions were 8.7%, and their Brookfield viscosities were about 60 centipoises at 25° C. using a No. 2 spindle at 100 rpm.

The metal plates to which the liquid coating composition is applied may be any of the types of plates now used in making lithographic printing plates. Thus they may be a standard grained aluminum plate which may or may not be backed up with one or more metals such as zinc and/or stainless steel for strength and dimensional stability. Bimetal plates comprising a thin layer of copper on stainless steel or aluminum and trimetal plates such as electrolytically deposited chromium on copper backed with zinc or stainless steel may also be used. Although it is possible to also use nonmetallic materials such as clay-coated paperboards as the plates, these are not normally suitable for long-run printing.

The liquid coating composition may be applied to the plate using any known technique suitable for forming a thin continuous film adhered to the plate. Such techniques include, but are not limited to, roll coating, flow coating, whirl or spin coating and spray coating.

The preparation of presensitized lithographic printing plates is illustrated in Example 8.

EXAMPLE 8

The liquid coating composition of Example 5 was applied to a standard grained aluminum plate 0.009 inches (0.229 mm) thick. This was done by standing the plate on edge in a near vertical position, i.e., about 80°, and pouring the coating composition over the face of the plate starting at the top to flow coat it on. The excess liquid was allowed to drain off and the coating on the plate was dried first at room temperature and then at 50° C. for 15 minutes. Care was taken not to expose the coated plate to sunlight or other bright light. Plates prepared in this manner may be stored under ambient conditions either in dark containers or under yellow fluorescent lights.

The presensitized plate thus prepared is illustrated in cross section in FIG. 1 and it is seen to comprise a backing plate 10 having a hydrophilic surface 11 to which is adhered a thin, continuous cross-linkable polymeric film 12 which is preferably no greater than about $6\mu$ thick. In accordance with this invention, the cross-linkable film comprises a block copolymer formed of blocks of copolyacrylate and polyurethane, an ultraviolet initiator and at least one cross-linking promoter. The copolyacrylate of the block copolymer is further characterized as comprising a copolymer of a hydroxy-containing acrylate and a second acrylate component which comprises one or more esters of acrylic acid or methacrylic acids or mixture thereof; and the polyurethane of the block copolymer is further characterized as being formed exclusively of polyoxybutylene as the prepolymer component.

A presensitized lithographic printing plate 13 was prepared from the presensitized plate of Example 8 as described in Example 9 and illustrated in FIGS. 2-4.

EXAMPLE 9

The presensitized plate 13 of Example 8 and a photographic negative 14 were placed in a standard vacuum frame (not shown) and exposed to light emitted from a 12-ampere conventional carbon arc light source 15 at a distance of 16 inches for 15 minutes. The negative comprised light transmitting areas 16 and nontransmitting areas 17 corresponding to the imaging and nonimaging areas, respectively, desired in the final lithographic plate.

As a result of exposure to the ultraviolet radiation, the film areas 18 were cross-linked to form the imaging areas leaving the non-cross linked, nonimaging areas 12. The exposed film (FIG. 3) was then developed by dissolving out the noncross-linked areas 12 with a suitable solvent, e.g., denatured ethanol. This can conveniently be done by flowing the solvent over the surface of the plate. The developed plate was then allowed to dry at room temperature, preferably using forced-air drying. A hydrophilic treating solution was wiped over the surface of the plate with a soft applicator to protect the finished nonimage areas of the lithographic plate from oxidation and to render the nonimaging areas hydrophlic. Exemplary of such a hydrophilic treating solution is a dilute aqueous solution (e.g., about 1% by weight) of a hydrolyzed copolymer of vinyl ether and maleic anhydride. The plate was dried again at 50° C. for 5 minutes and finally any excess of the hydrophilic treating agent was wiped off with a wet paper towel followed by a final drying at 50° C. for 5 minutes.

The resulting lithographic plate, as shown in FIG. 4, had a printing surface made up of oleophilic imaging areas 19, the thickness of which is grossly exaggerated, and hydrophilic nonimaging areas 20, these latter being essentially the original surface of the metal plate used.

This lithographic printing plate was placed in a Davidson 500 printing machine and 3600 copies of satisfactory printing quality had been run off when the test was discontinued. The ink used was Beacon B-9833 ink (sold by Beacon Printing Ink, Somerville, Mass.) and the fountain solution employed was made by mixing two ounces of Imperial Mark III fountain solution (sold by Lith-Kem-Ko Division of Rogers Corp., Claremont, N.H.) with one-half gallon of water and one ounce of a 5% by weight gum arabic solution.

It will thus be seen that the objects set forth above, among those made apparent from the preceding description, are efficiently attained and, since certain changes may be made in carrying out the above method and in the composition and the article set forth without departing from the scope of the invention, it is intended that all matter contained in the above description or shown in the accompanying drawings shall be interpreted as illustrative and not in a limiting sense.

We claim:

1. A liquid coating composition suitable for forming a radiation-cross-linkable film, comprising
    (a) a block copolymer formed of blocks of a copolyacrylate and a polyurethane, said copolyacrylate comprising a copolymer of a hydroxy-containing acrylate and a second acrylate component which comprises one or more esters of a non-hydroxy-containing acrylic acid or methacrylic acid or mixture thereof; and said polyurethane being formed by reacting a diisocyanate with polyoxybutylene to form a "diisocyanate-capped" prepolymer constituent of the said polyurethane;
    (b) a solvent for said block copolymer;
    (c) an ultraviolet initiator,
    (d) at least one cross-linking promoter; and
    (e) a wetting/adhesion promoting agent; said coating composition containing from about 5 to about 10 weight percent of said block copolymer and having a viscosity no greater than that which permits coating said composition onto the surface of a printing plate to form a film thereof no greater than about $6\mu$ in thickness.

2. A liquid coating composition in accordance with claim 1 wherein said hydroxy-containing acrylate is 2-hydroxyethyl acrylate, a hydroxypropyl acrylate, 2-hydroxyethyl methacrylate or a hydroxypropyl methacrylate.

3. A liquid coating composition in accordance with claim 1 wherein said polyoxybutylene has a molecular weight of about 2000 and said polyurethane blocks contain a chain extender.

4. A liquid coating composition in accordance with claim 1 wherein said solvent is ethylene glycol monomethyl ether, ethyl alcohol, n-propyl alcohol, isopropyl alcohol, or a blend of ethylene glycol monomethyl ether with methylethyl ketone, ethyl alcohol, dimethyl formamide or isopropyl alcohol.

5. A liquid coating composition in accordance with claim 1 wherein said ultraviolet initiator is phenanthrene quinone in a concentration from about 0.01% to about 5% by total block copolymer weight.

6. A liquid coating composition in accordance with claim 1 wherein said at least one cross-linking promoter is a multifunctional olefin cross-linking agent present in an amount up to about 20% by total block copolymer weight.

7. A liquid coating composition in accordance with claim 1 wherein said second acrylate is partially substituted with bromine.

8. A liquid coating composition in accordance with claim 1 wherein said viscosity of said composition ranges between about 25 and about 200 centipoises.

* * * * *